United States Patent
Kim (10) Patent No.: US 8,908,451 B2
(45) Date of Patent: Dec. 9, 2014

(54) DATA OUTPUT CIRCUIT OF SEMICONDUCTOR DEVICE

(71) Applicant: SK Hynix Inc., Icheon-si Gyeonggi-do (KR)

(72) Inventor: Jae Il Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 226 days.

(21) Appl. No.: 13/720,805

(22) Filed: Dec. 19, 2012

(65) Prior Publication Data

US 2014/0043926 A1 Feb. 13, 2014

(30) Foreign Application Priority Data

Aug. 7, 2012 (KR) .................. 10-2012-0086071

(51) Int. Cl.
*G11C 7/00* (2006.01)
*G11C 7/22* (2006.01)
*G11C 7/10* (2006.01)
*G11C 29/02* (2006.01)

(52) U.S. Cl.
CPC ............... *G11C 7/22* (2013.01); *G11C 7/1039* (2013.01); *G11C 7/1066* (2013.01); *G11C 7/222* (2013.01); *G11C 29/022* (2013.01); *G11C 29/023* (2013.01)
USPC ............ 365/194; 365/191; 365/193; 365/196

(58) Field of Classification Search
USPC .................................. 365/194, 193, 191, 196
See application file for complete search history.

(56) References Cited

U.S. PATENT DOCUMENTS 7,818,526 B2 10/2010 Jang et al.
2014/0140151 A1* 5/2014 Cha et al. ...................... 365/194

FOREIGN PATENT DOCUMENTS

KR 1020090071015 A 7/2009

* cited by examiner

*Primary Examiner* — Vu Le
*Assistant Examiner* — Han Yang
(74) *Attorney, Agent, or Firm* — William Park & Associates Patent Ltd.

(57) ABSTRACT

A data output circuit of a semiconductor device includes: a pattern data generation unit configured to generate pattern data in response to a bank selection signal, a variable delay unit configured to delay a source signal, which is generated in response to the bank selection signal, by a delay time corresponding to a delay control signal, a pattern control signal generation unit configured to generate a pattern control signal in response to an output signal of the variable delay unit, and a delay time control block configured to generate the delay control signal in response to the phases of the pattern control signal and the pattern data.

20 Claims, 6 Drawing Sheets

DATA OUTPUT CIRCUIT OF SEMICONDUCTOR DEVICE

CROSS-REFERENCES TO RELATED APPLICATION

The present application claims priority under 35 U.S.C. §119(a) to Korean application number 10-2012-0086071, filed on Aug. 7, 2012, in the Korean Intellectual Property Office, which is incorporated herein by reference in its entirety.

BACKGROUND

1. Technical Field

The present invention relates generally to a semiconductor device, and more particularly, to a data output circuit of a semiconductor device.

2. Related Art

After receiving a read command, a semiconductor device, e.g. a semiconductor memory device, transmits data stored in a corresponding memory cell to a pipe latch through a path, such as a global line GIO or the like.

The pipe latch receives and arranges the transmitted data in response to a control signal PINB, thereby generating output data.

A predetermined timing margin must be secured between the transmitted data and an input control signal in order to achieve stable data output.

Figure 1:
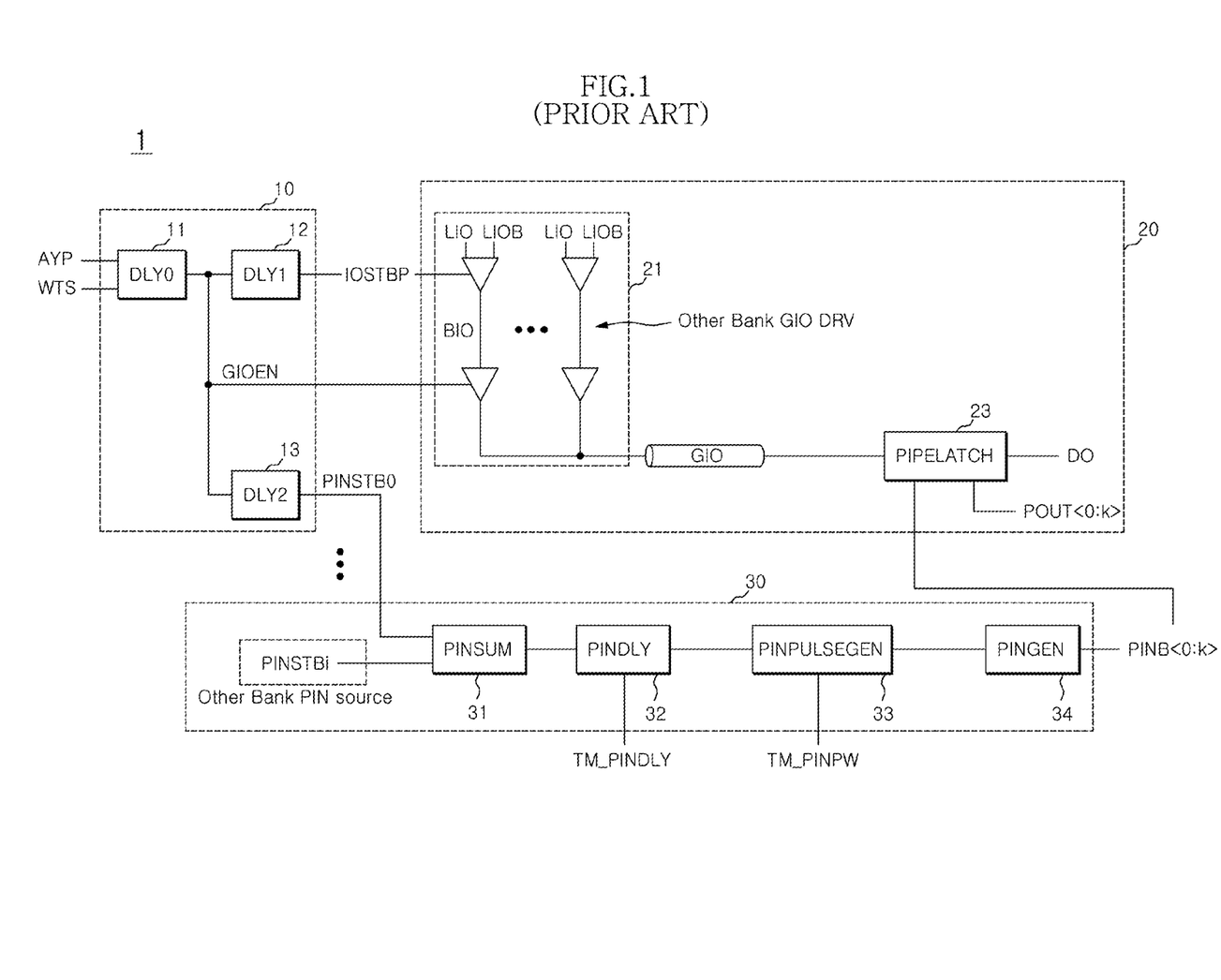
FIG. 1 is a schematic block diagram illustrating the configuration of a conventional data output circuit of a semiconductor device.

FIG. 1 is a schematic block diagram illustrating the configuration of a conventional data output circuit 1 of a semiconductor device.

As illustrated in FIG. 1, the conventional data output circuit 1 of a semiconductor device includes a signal generation block 10, a read data path block 20, and a control signal path block 30.

The signal generation block 10 includes a plurality of delays DLY0 to DLY2.

When a write flag signal WTS is inactivated in a read operation for example, the signal generation block 10 delays a bank selection signal AYP to generate a switching signal IOSTBP, a global line enable signal GIOEN, and a source signal PINSTB0.

The write flag signal WTS is a signal which stays in an active state (e.g. a high level) when a write operation is performed.

The bank selection signal AYP is a signal including bank address information.

The read data path block 20 includes a global line GIO, a plurality of drivers 21, and a pipe latch 23.

The plurality of drivers 21 drives and transmits data stored in a memory cell (not shown) to the global line GIO through data lines LIO, LIOB, and BIO in response to the switching signal IOSTBP and the global line enable signal GIOEN.

The pipe latch 23 receives and arranges data (hereinafter, referred to as "GIO data"), which is transmitted through the global line GIO, in response to a control signal PINB<0:k>, and then generates read data DO in response to a signal POUT<0:k>.

The read data DO is outputted to a pad DQ (not shown) through an output driver (not shown).

The control signal path block 30 includes a combination unit 31, a delay unit 32, a pulse width adjustment unit 33, and a signal generation unit 34.

The combination unit 31 combines and outputs the source signal PINSTB0 and source signals PINSTB1 to PINSTBi, which are outputted from another memory bank.

The delay unit 32 adjusts the delay time of the output signal of the combination unit 31 by a preset time according to a test mode, an option, or the like, and outputs the adjusted signal.

The pulse width adjustment unit 33 adjusts the pulse width of the output signal of the delay unit 32 by a preset value according to a test mode, an option, or the like, and outputs the adjusted signal.

The signal generation unit 34 receives the output signal of the pulse width adjustment unit 33, and generates a control signal PINB<0:k>.

According to the aforementioned conventional technique, the GIO data and the source signal PINSTB0 are generated in the same memory bank in a normal operation.

Therefore, a GIO-vs-PIN margin, which is a timing margin between the GIO data and the source signal PINSTB0, must be constant.

However, since the GIO data and the source signal PINSTB0 pass through a long RC line and a multistage logic circuit block, a variation timing margin depending on process, voltage, and/or temperature (PVT) may vary.

Additionally, a great number of parallel lines are used in the GIO data, so physical/electrical margin variables, such as a coupling effect and the like, further exist.

Since the GIO-vs-PIN margin (hereinafter, referred to as a "margin") shows timing differences between a simulation and an actually implemented circuit, it is difficult for a designer to select an appropriate margin.

When a large margin is set for the stability of an operation, the characteristics of asynchronous parameters, such as an address access time (tAA), are deteriorated. When a small margin is set for improvement of the tAA characteristic, an operation fail may result.

SUMMARY

A data output circuit of a semiconductor device capable of automatically adjusting a read operation-related timing margin according to the characteristics of a semiconductor device is described herein.

In an embodiment, a data output circuit of a semiconductor device includes: a pattern data generation unit configured to generate pattern data in response to a bank selection signal; a variable delay unit configured to delay a source signal, which is generated in response to the bank selection signal, by a delay time corresponding to a delay control signal; a pattern control signal generation unit configured to generate a pattern control signal in response to an output signal of the variable delay unit; and a delay time control block configured to generate the delay control signal in response to the phases of the pattern control signal and the pattern data.

In another embodiment, a data output circuit of a semiconductor device includes: a pattern data generation unit configured to transmit pattern data, which is generated in response to a margin adjustment enable signal and a bank selection signal, through a global line; a variable delay unit configured to delay a source signal, which is generated in response to the bank selection signal, by a delay time corresponding to a delay control signal; a pattern control signal generation unit configured to generate a pattern control signal in response to the margin adjustment enable signal and an output signal of the variable delay unit; and a delay time control block configured to generate the delay control signal by comparing phases of the pattern control signal and the pattern data in response to the margin adjustment enable signal.

BRIEF DESCRIPTION OF THE DRAWINGS

Features, aspects, and embodiments are described in conjunction with the attached drawings, in which.

DETAILED DESCRIPTION

Hereinafter, a data output circuit of a semiconductor device according to the present invention will be described below with reference to the accompanying drawings through various embodiments.

Figure 2:
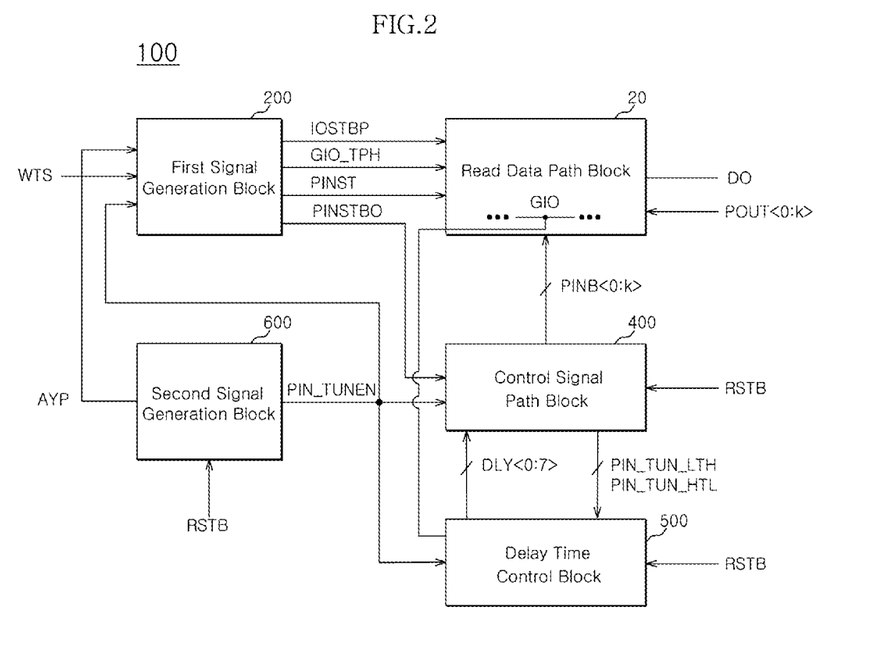
FIG. 2 is a schematic block diagram illustrating the configuration of a data output circuit of a semiconductor device according to an embodiment.
Figure 3:
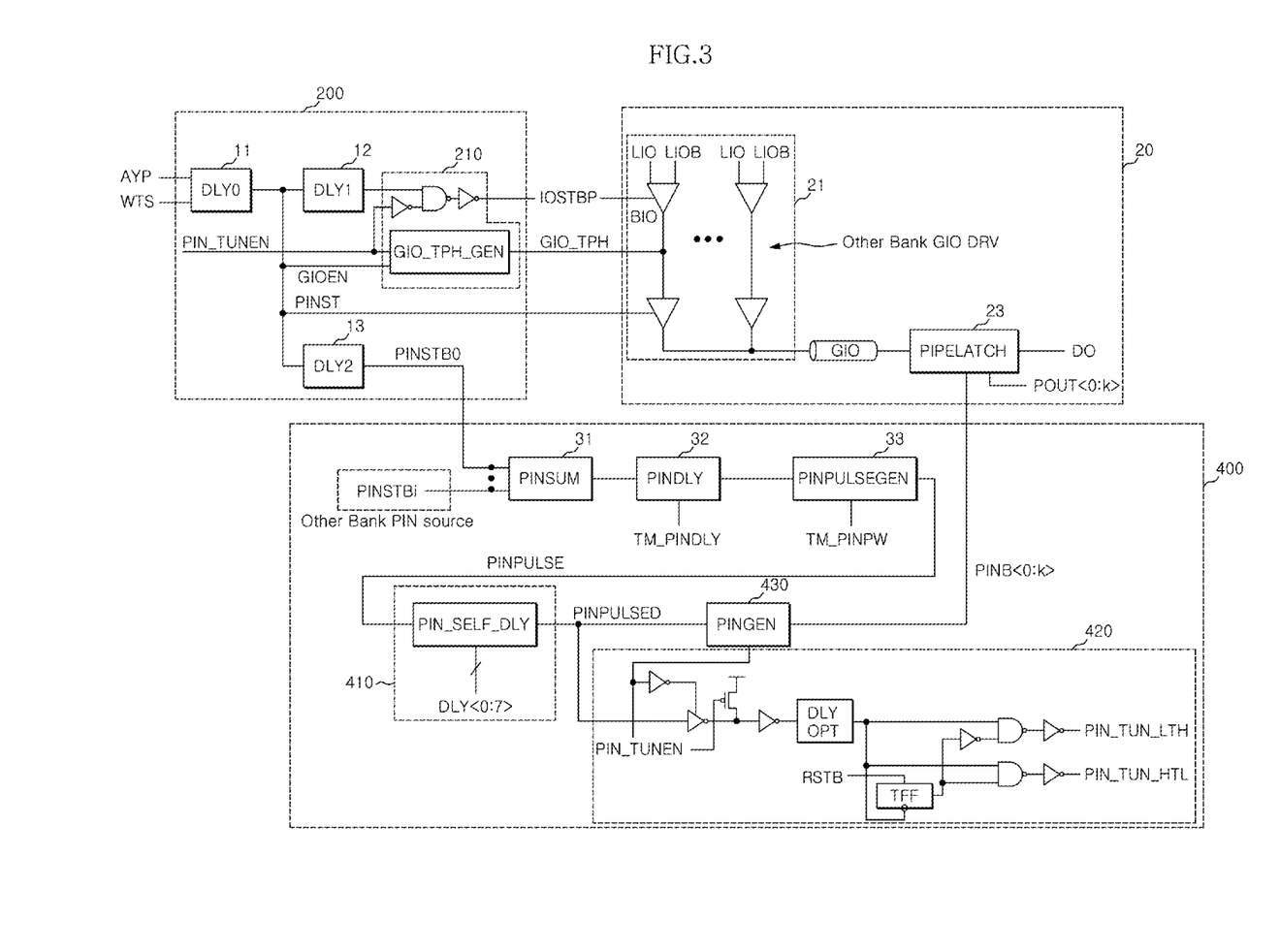
FIG. 3 is a circuit diagram illustrating the internal configurations of a first signal generation block, a read data path block, and a control signal path block, shown in FIG. 2.

FIG. 2 is a schematic block diagram illustrating the configuration of a data output circuit 100 of a semiconductor device according to an embodiment, and FIG. 3 is a circuit diagram illustrating the internal configurations of a first signal generation block 200, a read data path block 20, and a control signal path block 400, shown in FIG. 2.

As illustrated in FIG. 2, the data output circuit 100 of a semiconductor device according to an embodiment includes a first signal generation block 200, a read data path block 20, a control signal path block 400, a delay time control block 500, and a second signal generation block 600.

As illustrated in FIG. 3, the first signal generation block 200 includes a plurality of delays DLY0 to DLY2, and a pattern generation unit GIO_TPH_GEN 210 that includes additional logic gates.

When a write flag signal WTS is inactivated such as in a read operation, the plurality of delays DLY0 to DLY2 delay a bank selection signal AYP to generate a plurality of switching signals IOSTBP and PINST, a global line enable signal GIOEN, and a source signal PINSTB0.

The write flag signal WTS is a signal which stays in an active state (e.g. a high level) when a write operation is performed.

The bank selection signal AYP is a signal including bank address information.

When a margin adjustment enable signal PIN_TUNEN is activated, the pattern generation unit 210 generates pattern data GIO_TPH in response to a global line enable signal GIOEN.

The pattern generation unit 210 can be configured to generate the pattern data GIO_TPH when a logic low level transitions to a logic high level.

Data on a global line adjacent to a global line GIO on which the current margin adjustment operation is performed is configured to be transition in complementary manner.

For example, when pattern data of a first GIO is transitioned in a low-high-low manner, data of a second GIO adjacent to the first GIO is controlled to be transitioned in a high-low-high manner.

The pattern generation unit 210 inactivates the switching signal IOSTBP when the margin adjustment enable signal PIN_TUNEN is activated.

The read data path block 20 includes a global line GIO, a plurality of drivers 21, and a pipe latch 23.

The plurality of drivers 21 drives and transmits either data, stored in a memory cell (not shown), or pattern data GIO_TPH to the global line GIO through data lines LIO, LIOB, and BIO in response to the switching signals IOSTBP and PINST.

The switching signal PINST may have the same timing and phase as the global line enable signal GIOEN.

When the switching signal IOSTBP is activated, the plurality of drivers 21 drives and transmits data, stored in a memory cell, to the global line GIO through the data lines LIO, LIOB, and BIO.

When the switching signal IOSTBP is inactivated, the plurality of drivers 21 drives and transmits pattern data GIO_TPH to the global line GIO through the data lines LIO, LIOB, and BIO.

The pipe latch 23 receives and arranges GIO data, which is transmitted through the global line GIO, in response to a control signal PINB<0:k>, and then generates read data DO in response to a signal POUT<0:k>.

The read data DO is outputted to a pad DQ (not shown) through an output driver (not shown).

The control signal path block 400 includes a combination unit 31, a delay unit 32, a pulse width adjustment unit 33, a variable delay unit 410, a pattern control signal generation unit 420, and a signal generation unit 430.

The combination unit 31 combines and outputs the source signal PINSTB0 and source signals PINSTB1 to PINSTBi, which are outputted from another memory bank.

The delay unit 32 adjusts the delay time of an output signal of the combination unit 31 by a preset time according to a test mode, an option, or the like, and outputs the adjusted signal.

The pulse width adjustment unit 33 adjusts the pulse width of an output signal of the delay unit 32 by a preset value according to a test mode, an option, or the like, and outputs the adjusted signal.

The variable delay unit 410 outputs the source signal PINPULSED, which has been subjected to a margin adjustment by a preset value, by outputting output signal PINPULSE of the pulse width adjustment unit 33 after delaying it by a delay time varied in response to a delay control signal DLY<0:7>.

When the margin adjustment enable signal PIN_TUNEN is activated, the pattern control signal generation unit 420 generates first and second pattern control signals PIN_TUN_LTH and PIN_TUN_HTL, respectively, in response to an output signal of the variable delay unit 410.

The first pattern control signal PIN_TUN_LTH is a signal for comparison with pattern data GIO_TPH when a low-to-high transition is performed, and the second pattern control signal PIN_TUN_HTH is a signal for comparison with pattern data GIO_TPH when a high-to-low transition is performed.

Each of the first pattern control signal PIN_TUN_LTH and second pattern control signal PIN_TUN_HTL is generated according to the pulse sequence (even/odd) of an output signal of the variable delay unit 410.

For example, with respect to odd-numbered output signals of the variable delay unit 410, the first pattern control signal PIN_TUN_LTH or the second pattern control signal PIN_TUN_HTL can be generated.

Similarly, with respect to even-numbered output signals of the variable delay unit 410, the second pattern control signal PIN_TUN_HTL or the first pattern control signal PIN_TUN_LTH can be generated.

When the margin adjustment enable signal PIN_TUNEN is inactivated, the pattern control signal generation unit 420 inactivates the first and second pattern control signals PIN_TUN_LTH and PIN_TUN_HTL without regard to the output signals of the variable delay unit 410.

The pattern control signal generation unit 420 is initialized by a reset signal RSTB.

The pattern control signal generation unit 420 can be constituted by a delay option DLY OPT, a T flip-flop TFF, a transistor, a plurality of inverters, and a plurality of NAND gates.

A signal generation unit 430 generates a control signal PINB<0:k> in response to an output signal of the variable delay unit 410.

When the margin adjustment enable signal PIN_TUNEN is activated, the signal generation unit 430 inactivates the control signal PINB<0:k>.

Figure 4:
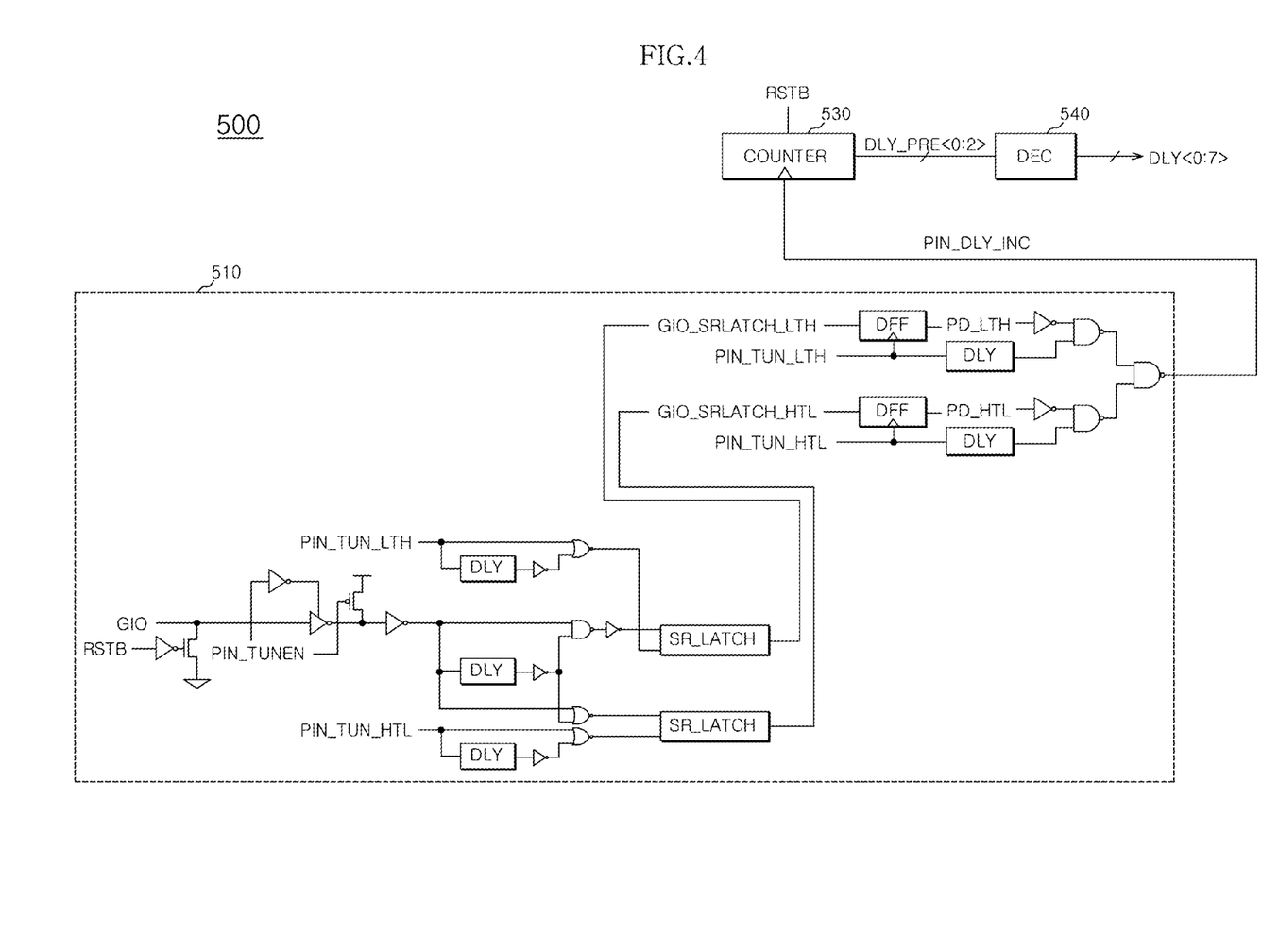
FIG. 4 is a circuit diagram illustrating the internal configuration of a delay time control block shown in FIG. 2.

FIG. 4 is a circuit diagram illustrating the internal configuration of the delay time control block 500 shown in FIG. 2.

The delay time control block 500 is configured to generate a delay control signal DLY<0:7> in response to phase detection results of the pattern data GIO_TPH, transmitted through the global line GIO, and the first and second pattern control signals PIN_TUN_LTH and PIN_TUN_HTL, transmitted via the control signal path block 400.

As illustrated in FIG. 4, the delay time control block 500 includes a detection unit 510, a counter 530, and a decoder 540.

When the margin adjustment enable signal PIN_TUNEN is activated, the detection unit 510 generates a detection signal PIN_DLY_INC in response to the pattern data GIO_TPH transmitted through the global line GIO and the first and second pattern control signals PIN_TUN_LTH and PIN_TUN_HTL.

The detection unit 510 can be constituted by a plurality of delays DLY, a plurality of latches SR_LATCH, a plurality of flip-flops DFF, a plurality of logic gates, and a plurality of transistors.

The detection unit 510 is initialized by the reset signal RSTB.

The counter 530 counts the detection signal PIN_DLY_INC and generates a preliminary delay control signal DLY_PRE<0:2>.

The counter 530 is initialized by the reset signal RSTB.

The decoder 540 decodes the preliminary delay control signal DLY_PRE<0:2>, and generates a delay control signal DLY<0:7>.

Figure 5:
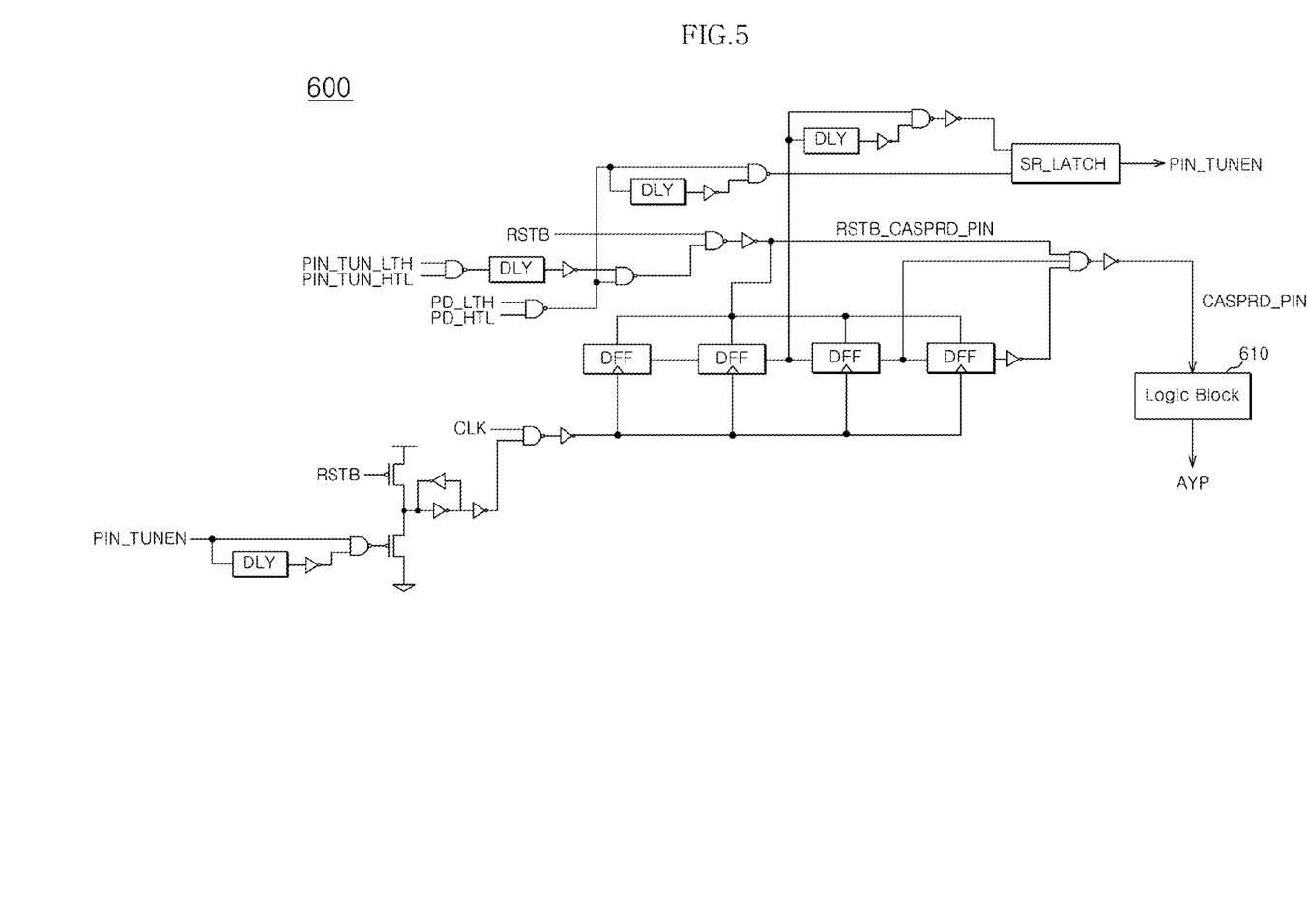
FIG. 5 is a circuit diagram illustrating the internal configuration of a second signal generation block shown in FIG. 2.

FIG. 5 is a circuit diagram illustrating the internal configuration of the second signal generation block 600 shown in FIG. 2.

As illustrated in FIG. 5, the second signal generation block 600 includes a plurality of delays DLY, a latch SR_LATCH, a plurality of flip-flops DFF, a plurality of logic gates, and a logic block 610.

The second signal generation block 600 is configured to be initialized by the reset signal RSTB and then to activate the margin adjustment enable signal PIN_TUNEN after a set time period, e.g. 2tCK.

After the margin adjustment enable signal PIN_TUNEN is activated and the set time, e.g. 1tCK, elapses, the second signal generation block 600 generates a preliminary signal CASPRD_PIN.

The logic block 610 activates the bank selection signal AYP in response to the preliminary signal CASPRD_PIN.

The second signal generation block 600 activates a source reset signal RSTB_CASPRD_PIN in response to the first and second pattern control signals PIN_TUN_LTH and PIN_TUN_HTL and the internal signals PD_LTH and PD_HTL of the detection unit 510 of FIG. 4 to reactivate the preliminary signal CASPRD_PIN.

Figure 6:
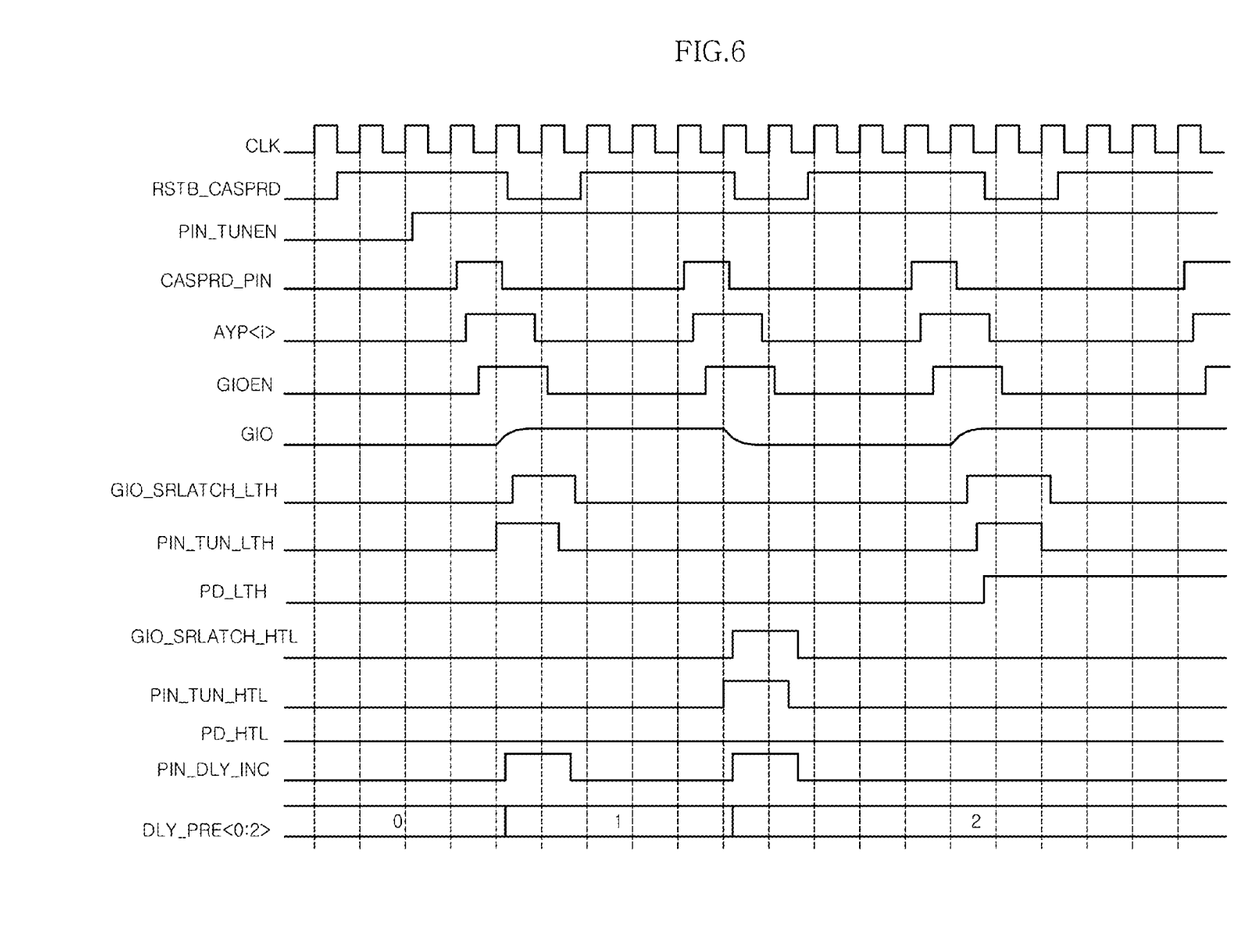
FIG. 6 is a waveform diagram illustrating a data output operation according to an embodiment.

FIG. 6 is a waveform diagram illustrating a data output operation according to an embodiment.

In the following description, a data output operation according to an embodiment will be explained with reference to FIGS. 2 to 6.

After an initialization procedure of a semiconductor device is performed, such as after the reset signal RSTB is activated and a set time period (e.g. 2tCK) elapses, the margin adjustment enable signal PIN_TUNEN is activated by the second signal generation block 600.

Subsequently, after the margin adjustment enable signal PIN_TUNEN is activated by the second signal generation block 600 and a set time period (e.g. 1tCK) elapses, a preliminary signal CASPRD_PIN having a set pulse width (e.g. 1tCK) is generated.

A bank selection signal AYP<i> corresponding to a memory bank selected according to the generation of the preliminary signal CASPRD_PIN is generated.

The bank selection signal AYP<i> generates a global line enable signal GIOEN, and pattern data GIO_TPH is toggled by the global line enable signal GIOEN.

The pattern data GIO_TPH is transitioned from a logic low level to a logic high level, and is transitioned whenever a global line enable signal GIOEN is generated.

A source signal PINSTB0 is generated by the bank selection signal AYP<i>.

The source signal PINSTB0 is delayed through the variable delay unit 410, and then generates first and second pattern control signals PIN_TUN_LTH and PIN_TUN_HTL through the pattern control signal generation unit 420.

The first pattern control signal PIN_TUN_LTH is a signal for comparison with pattern data GIO_TPH when a low-to-high transition is performed, and the second pattern control signal PIN_TUN_HTL is a signal for comparison with pattern data GIO_TPH when a high-to-low transition is performed.

The phases of the first and second pattern control signals PIN_TUN_LTH and PIN_TUN_HTL are compared with the phase of the transition timing of the pattern data GIO_TPH, such as the global line GIO.

Consequently, it can be determined whether or not the activation timing of the control signal PINB<0:k> is earlier than the transition timing of the global line GIO by comparing the phases of the first and second pattern control signals PIN_TUN_LTH and PIN_TUN_HTL with the phase of the transition timing of the global line GIO.

When the activation timing of the control signal PINB<0:k> is earlier than the transition timing of the global line GIO, a detection signal PIN_DLY_INC is generated.

Whenever a detection signal PIN_DLY_INC is generated, the delay control signal DLY<0:7> is changed to a value that increases the delay time, thereby increasing the delay time of the variable delay unit 410 of FIG. 3.

The aforementioned procedure is repeated until the phases of the first and second pattern control signals PIN_TUN_LTH and PIN_TUN_HTL are later than the phase of the transition timing of the global line GIO.

According to an embodiment, the aforementioned margin adjustment operation can be performed in an initial process for a semiconductor device, so that the GIO-vs-PIN margin can be adjusted to an optimum level regardless of PVT variation.

According to an embodiment, it is possible to stably output data regardless of PVT variation.

While certain embodiments have been described above, it will be understood to those skilled in the art that the embodiments described are by way of example only. Accordingly, the circuit described herein should not be limited based on the described embodiments. Rather, the circuit described herein should only be limited in light of the claims that follow when taken in conjunction with the above description and accompanying drawings.

What is claimed is:

1. A data output circuit of a semiconductor device, comprising:
    a pattern data generation unit configured to generate pattern data in response to a bank selection signal;
    a variable delay unit configured to delay a source signal, which is generated in response to the bank selection signal, by a delay time corresponding to a delay control signal;
    a pattern control signal generation unit configured to generate a pattern control signal in response to an output signal of the variable delay unit; and
    a delay time control block configured to generate the delay control signal in response to the phases of the pattern control signal and the pattern data.

2. The circuit according to claim 1, further comprising a pipe latch configured to receive and arrange data, which is transmitted through a global line, in response to an input control signal.

3. The circuit according to claim 2, further comprising a signal generation unit configured to generate the input control signal in response to an output signal of the variable delay unit.

4. The circuit according to claim 1, further comprising a driver configured to transmit the pattern data to a global line in response to a switching signal.

5. The circuit according to claim 1, wherein the pattern control signal generation unit is configured to distinctively generate a first pattern control signal and a second pattern control signal according to a sequence of pulses of an output signal of the variable delay unit.

6. The circuit according to claim 1, wherein the delay time control block comprises:
    a detection unit configured to generate a detection signal in response to a result of phase comparison between the pattern data and the pattern control signal;
    a counter configured to count the detection signal and to generate a preliminary delay control signal; and
    a decoder configured to decode the preliminary delay control signal and to generate the delay control signal.

7. The circuit according to claim 6, wherein the detection unit further comprises a plurality of delays, latches, flip-flops, logic gates, and transistors.

8. A data output circuit of a semiconductor device, comprising:
    a pattern data generation unit configured to transmit pattern data, which is generated in response to a margin adjustment enable signal and a bank selection signal, through a global line;
    a variable delay unit configured to delay a source signal, which is generated in response to the bank selection signal, by a delay time corresponding to a delay control signal;
    a pattern control signal generation unit configured to generate a pattern control signal in response to the margin adjustment enable signal and an output signal of the variable delay unit; and
    a delay time control block configured to generate the delay control signal by comparing the phases of the pattern control signal and the pattern data in response to the margin adjustment enable signal.

9. The circuit according to claim 8, further comprising a pipe latch configured to generate read data by receiving and arranging the pattern data in response to an input control signal.

10. The circuit according to claim 9, further comprising a signal generation unit configured to generate the input control signal in response to an output signal of the variable delay unit.

11. The circuit according to claim 8, further comprising a driver configured to transmit the pattern data to the global line in response to activation of a switching signal.

12. The circuit according to claim 11, wherein the pattern data generation unit is configured to inactivate the switching signal when the margin adjustment enable signal is activated.

13. The circuit according to claim 8, wherein the pattern data generation unit is configured to transition the pattern data in response to the bank selection signal.

14. The circuit according to claim 8, wherein the pattern control signal generation unit is configured to distinctively generate a first pattern control signal and a second pattern control signal according to a sequence of pulses of an output signal of the variable delay unit.

15. The circuit according to claim 13, wherein the pattern control signal generation unit is configured to distinctively generate a first pattern control signal corresponding to a low-to-high transition of the pattern data, and a second pattern control signal corresponding to a high-to-low transition of the pattern data according to the sequence of pulses of an output signal of the variable delay unit.

16. The circuit according to claim 8, wherein the delay time control block comprises:
    a detection unit configured to generate a detection signal in response to a result of phase comparison between the pattern data and the pattern control signal;
    a counter configured to count the detection signal and to generate a preliminary delay control signal; and
    a decoder configured to decode the preliminary delay control signal and to generate the delay control signal.

17. The circuit according to claim 16, wherein the detection unit further comprises a plurality of delays, latches, flip-flops, logic gates, and transistors.

18. The circuit according to claim 8, further comprising a circuit block configured to generate the margin adjustment enable signal in response to a reset signal.

19. The circuit according to claim 18, wherein the circuit block is configured to generate a preliminary signal, in response to the margin adjustment enable signal, for generating the bank selection signal.

20. The circuit according to claim 19, wherein the circuit block is configured to reactivate the preliminary signal in response to the pattern control signal.

* * * * *